United States Patent [19]

Garn et al.

[11] Patent Number: 5,594,458

[45] Date of Patent: Jan. 14, 1997

[54] COMB GENERATOR, DEVICE AND PROCESS FOR CALIBRATING MEASUREMENT SECTIONS

[75] Inventors: Heinrich Garn, Vienna; Josef Rasinger, Modling; Wolfgang Mullner, Landegg, all of Austria

[73] Assignee: Oesterreichisches Forschungszentrum Seibersdorf Ges.m.b.H., Seibersdorf, Austria

[21] Appl. No.: 859,504

[22] PCT Filed: Dec. 10, 1990

[86] PCT No.: PCT/AT90/00119

§ 371 Date: Jul. 17, 1992

§ 102(e) Date: Jul. 17, 1992

[87] PCT Pub. No.: WO91/09317

PCT Pub. Date: Jun. 27, 1991

[30] Foreign Application Priority Data

Dec. 11, 1989 [AT] Austria .................................. 2796/89

[51] Int. Cl.⁶ .................................................. G01R 29/08
[52] U.S. Cl. .................................................. 343/703; 455/115
[58] Field of Search .......................... 343/703; 342/165; 455/115; H01Q 21/29

[56] References Cited

U.S. PATENT DOCUMENTS

| | | | |
|---|---|---|---|
| 1,982,331 | 11/1934 | Taylor | 343/703 |
| 3,296,533 | 1/1967 | Karpinsky | 343/703 |
| 4,468,669 | 8/1984 | Wang et al. | 343/703 |
| 4,498,193 | 2/1985 | Richardson | 455/1 |
| 4,864,636 | 9/1989 | Brunius | 455/118 |
| 5,086,508 | 2/1992 | Furuno | 455/115 |

FOREIGN PATENT DOCUMENTS

| | | | |
|---|---|---|---|
| 2033375 | 4/1992 | Canada | 343/703 |
| 2602476 | 7/1977 | Germany . | |
| 3322325 | 1/1984 | Germany . | |
| 60-73382 | 4/1985 | Japan . | |
| 2123256 | 1/1984 | United Kingdom . | |

OTHER PUBLICATIONS

H. G. Ove, *Elektrotechnik & Informationstechnik*, vol. 106, No. 4, Apr. 1989, pp. 134–145.
S. A. Stone, *1986 IEEE International Symposium on Electromagnetic Compatibility*, Sep. 1986, pp. 362–365.
H. Garn, *IEEE 1989 National Symposium on Electromagnetic Compatibility*, May 1989 pp. 390–393.
G. S. Pettit et al., *IEEE 1985 International Symposium on Electromagnetic Compatibility*, Aug. 1985, pp. 176–182.
J. R. Andrews, *Q.S.T. Amateur Radio*, vol. 56, May 1972, pp. 16–18.
Masanobu Kominami et al., *IEEE Transactions of Antennas and Propagation*, AP–32. No. 2, Feb. 1984, pp. 154–158.
International Search Report in connection with International Application No. PCT/AT 90/00119.

*Primary Examiner*—Donald Hajec
*Assistant Examiner*—Tan Ho
*Attorney, Agent, or Firm*—Sandler Greenblum & Bernstein

[57] ABSTRACT

A process and a device are useful for calibrating measurement sections for measuring noise field strengths of electrical appliances and/or to determine calibration factors for measurements of noise field strengths by means of the frequency spectrum, in particular up to 1 GHz. To this end, fields are generated by the comb generator in a known reference measurement section, preferably a standard measurement section or a free-field test site, and in a measurement section to be measured with a single calibration device or with a single interference emitter having, in particular, the same operating parameters. These fields are measured in the same manner and the calibration factors are calculated in function of the frequency by comparing the measured values.

43 Claims, 8 Drawing Sheets

COMB GENERATOR, DEVICE AND PROCESS FOR CALIBRATING MEASUREMENT SECTIONS

BACKGROUND OF THE INVENTION

1. Field of the Invention

The invention relates to a process for calibrating measurement sections for measuring the interference field strength of electrical devices, for example for determining calibration factors for measuring the interference field strength by means of the frequency spectrum, in particular up to 1 GHz, where fields are generated by means of a comb generator in a known reference measurement section, for example a standard measurement section or an open air test site, and in a measurement section to be measured, with one and the same calibration device (radio interference emitter), in particular with the same operating parameters, these fields are each measured in the same way and the calibration factors are calculated from the comparison of the measured values as a function of the frequency. Finally, the invention also relates to a process for determining the calibration factors of a measurement section or a process for simulating the interference emissions of test object or actual electrical devices.

The invention furthermore relates to a comb generator with a possibly battery-operated oscillator to power an antenna. Furthermore, the invention relates to a calibrating device for measuring devices or measurement sections for interference field strength measurements, comprising a battery-operated comb generator, possibly of the type of the invention, which comb generator is employed for powering the antenna and which is particularly free of metallic conductors. Furthermore, the invention relates to a radio interference simulator, also with a possibly battery-operated comb generator.

2. Discussion of the Background of the Invention and Material Information

Processes for calibrating measurement sections for interference field strength measurements of electrical devices are known to the extent that in a known reference measurement section the measuring data are obtained from a single transmitting antenna and appropriate measurements are taken in the measurement section to be calibrated at the same radio interference transmitter and the appropriate calibration factors are obtained from a comparison of the two measurements. Such a process is known, for example, from e&i-Elektrotechnik & Informationstechnik (e&i Electrical Technology & Information Technology), Vol. 106 (1989), No. 4, pp. 134 to 145, or IEEE 1989 National Symposium on Electromagnetic Compatibility, May 23–25, p. 391, column 1. A similar process is known from 1986 IEEE International Symposium on Electromagnetic Compatibility, Sep. 16–18, 1986, pp. 362 to 365.

A direction-finding antenna system, using a dipole and a coil antenna is known from German Patent Document DE-A-2 602 476 which, however, cannot be used for calibration purposes.

The triggering of at least two antennas having different transmitting characteristics for improving the response properties of a radar installation is known from Patent Abstracts of Japan, Vol. 9, No. 210 (P-383) 1938, Aug. 28, 1985; however, such a radar installation cannot be used for calibrating measurements of the type mentioned.

Finally, the use of a bipolar transistor operated in a controlled avalanche breakthrough mode, the frequency-stable signal of which obtained during breakthrough extends up to 1 GHz, for providing a pulse generator is known from Q.S.T. amateur radio, Vol. 56, No. 5, May 1972, pp. 15, 16. The use of such transistors for comb generators or the use of such pulse generators for powering antennas for calibrating purposes, however, cannot be found in this reference.

Electrical and electronic devices generate electromagnetic fields. This is a result of the physical fact that every electrical current which can be changed over time results in the emission of electromagnetic waves.

In the case of a radio transmitter, these waves are generated on purpose and are desirable (radio waves). Electrical currents which can be changed over time are also employed or generated in electrical or electronic devices, for example in computers, household devices or the like. Although these currents are purposely generated, the wave emission or field generation connected with the currents is not desirable, since the function of other electrical or electronic systems can be interfered with because of them. In particular, undesirable effects of this type have to be prevented where electronic systems which are relevant in connection with safety could be interfered with, for example the control electronics in aircraft or motor vehicles, medical-technical devices, etc. For this reason the undesirable wave emission by electronic devices must be reduced to less than a maximally permissible value by technical means, for example shielding of housings, filtering of lines, etc.

An important indicator of the quality of the products of the electrical and electronic industry is their "electromagnetic compatibility". To test the presence of this quality in a product it is necessary to measure not only the active interference capability (emission of electromagnetic fields), but also the interference resistance (against penetration of such fields).

Limit values of the permissible interference emission or interference field strength are determined by the licensing offices (for example the Austrian Postal and Telegraphic Administration) for the area of emissions. The measuring processes for determining the interference field strength generated by a test object are standardized. The measurements can be performed either in the open, i.e. on a so-called "open air test site", or in electromagnetically shielded sheds lined with high-frequency absorbers (absorber sheds). The latter have the advantage of being free from interference by extraneous fields (radio transmitters) as well as being independent of weather. The high-frequency absorbers are required for the reduction of the reflection by the walls of the electromagnetic waves emitted by the test object.

The wave propagation conditions of a measuring site used for interference field strength measurements have an important effect on the measured result. Completely different measured values can be obtained from one and the same test object if two operating sites are selected which are different in regard to the wave propagation conditions. In particular in measuring sheds, undesirable reflections by the absorber walls can distort the measured results in an undue manner. Calibration of the measurement section is the only remedy.

A measuring procedure was standardized (DIN-VDE 0877, Part 2) for calibrating an open field measuring site. There is no precise determination for absorber sheds; the method standardized for the open field is completely insufficient for absorber sheds because completely different environmental conditions prevail. In this type of calibrating measurement sections in accordance with the concept of field damping, the transmission damping between two equally polarized half-wave dipoles erected on the open field measuring site is designated as field damping, if standardized spatial arrangements and measuring processes are observed, such as described in VDE 0877, Part 2 (1985). Field damping measured in the actual field must be compared with the corresponding, theoretically calculated values of an ideal site, where deviations during the interference field strength measurements of test objects on this field are taken into consideration as correction values. Thus, the calculation of the calibration factors on the basis of a comparison of open field measurement site measuring values with theoretical values is performed.

With this method it is assumed that measurement site properties which are not ideal have the same effect on field damping measurements as on field strength measurements of test objects. However, this is particularly not the case, because actual test objects may have completely different geometric dimensions than resonating half-wave dipoles and it is possible that test objects generate a completely different field distribution than the dipole antennas employed for calibration.

Strictly speaking, correction terms determined by field damping measurement therefore most likely do not apply to actual test objects; this fact can lead to impermissibly high measurement errors, in particular in the course of interference field strength measurements in absorber sheds which had been calibrated in accordance with the concept of field damping.

Furthermore, radio interference emitters with dipole-like transmission antennas are known, which include battery-operated comb generators fixedly connected with a linear (dipole-like) transmission antenna. Such devices can be employed for comparison measurements between different measurement sections; in this case, again, only a quite specific field distribution is generated and all results of such comparison measurements again only apply to this single field distribution. A generalization of the measurement results obtained to include arbitrary actual test objects is not possible in absorber sheds measured in this way.

Furthermore, radio interferences with a spherical dipole antenna are known, which include battery-operated comb generators installed in two metallic, electrically insulated hemispheres of a ball, which constitutes a spherical dipole. Such devices can be used in the same way as the previously described radio interference emitters, but again only one particular field distribution is being measured and the measurement results obtained therefore do not have general validity.

Thus all three known types of calibrating devices have the disadvantage that each can only generate a single type of field distribution; however, as a rule actual electrical devices generate a plurality of highly different field images. In order to be able to perform interference field strength measurements at frequencies below approximately 150 MHz in the absorber sheds predominantly employed in today's EMC (electromagnetic compatibility) measuring technology, it is necessary that the measurement section in the shed be calibrated for all actually occurring field distributions. If calibration is performed for only one field distribution and if these calibration factors are used in all testing of electronic devices, the measuring uncertainty can increase far beyond the acceptable value.

A pure interference emitter is furthermore known from German Published, Non-Examined Patent Application DE-OS 3 322 325, which includes a conventional comb spectrum generator, the pulses of which are filtered and amplified and are then supplied to the antenna. With this it is intended to generate interference fields at a considerable distance by means of high transmission output. This known interference emitter is unsuitable for calibrating measurement sections, because its frequency band is limited and the emitted output is not designed for near field measurements.

SUMMARY OF THE INVENTION

It is the object of the invention to provide calibrating devices and corresponding calibrating processes, by means of which the disadvantages of the known devices and methods of operation can be avoided and calibration factors, which are suitable for practical work, can be determined, or measurement sections generated which have a standard value. A further object of the invention is the provision of a comb generator, which can be advantageously used for these steps.

A comb generator of the type mentioned above is characterized in accordance with the invention in that a (bipolar) transistor, operated in a controlled avalanche breakthrough mode, is connected downstream of the oscillator for powering the antenna with an amplitude- and frequency-stable comb spectrum extending in particular up to 1 GHz, and particularly with a transmission output of up to 0.07 mW, preferably up to 0.1 mW per spectral line, the signal of which, obtained during breakthrough, is supplied to the antenna arrangement as the comb spectrum. In addition to its amplitude and frequency stability, a comb generator of this type offers the simultaneous advantage of sufficiently high output and simple construction.

A calibrating device for measuring devices or measurement sections for interference field strength measurements of the type mentioned above is characterized in accordance with the invention in that the comb generator is free of metallic conductors, characterized in that the comb generator which generates a frequency- and amplitude- stable comb spectrum can be coupled with at least two antennas of different transmitting characteristics, for which at least one coupling member and/or at least one net for adapting the different antennas to the comb generator is provided.

A radio interference simulator of the type mentioned above, which can be used for calibrating measurement sections, is characterized in accordance with the invention in that the comb generator, which generates a frequency- and amplitude-stable comb spectrum, is coupled with at least two antennas of different transmitting characteristics, where at least one coupling member and/or at least one net for adapting the different antennas to the comb generator is provided, and that all antennas connected to the comb generator are simultaneously powered in operation by the comb generator.

These calibrating devices or the radio interference simulator are simple and operationally safe devices, set to transmit different waves, which generate correspondingly different field distributions in the measurement sections, where calibration factors are determined for each of the individual field distributions, so that test objects can be measured not only in respect to a characterized field distribution, but measured values for the most different emitted field formations are evaluated and the entire interference spectrum of the test object can be determined.

It is possible to simulate the radio interference emitted by almost all electrical devices optimally by means of the comb generator of the invention or the calibrating device of the invention. It is possible in particular to simulate the immediate close area of the interfering device up to a distance of approximately 30 m and to calculate the appropriate calibrating values. The transmitting output of the devices of the invention can be calculated to be comparatively low, but a sufficiently broad, amplitude- and frequency-stable comb spectrum is nevertheless obtained. As high as possible a number of measuring frequencies is made available without narrowing the spectrum by filters; amplification of the output of the antenna signal is not necessary, because a sufficient output is made available by the transistor operated in the avalanche breakthrough mode. A decreased structural size, reduced current use and thus the possibility of battery operation over a greater period of time are made possible by means of this. This is also of particular importance, because with conventional interference emitters the transmitting antennas are optimized in respect to the best attainable transmission effect, while in connection with the devices of the invention the antennas are selected such that with their use it is possible to simulate the transmissions of electrical devices in the best way possible.

Because of the employment of a transistor operated in a controlled avalanche breakthrough mode, a very short pulse length is furthermore achieved and with that a comb spectrum up to more than 1 GHz without the need of using expensive amplifiers.

A method of the type mentioned above for calibrating measurement sections is characterized by the invention in that, in the measurement section to be measured and in the reference measurement section, fields are generated and measured in successive transmitting measurement cycles by means of antennas having at least two different transmitting characteristics and the calibration factors for each one of the fields and/or the field strength distribution allocated to the transmitting antenna are calculated.

Another method for determining the calibration factors of measurement sections is characterized by the invention in that the emitting characteristic, i.e. the spatial distribution of the electrical and magnetic field components (field distribution) of a test object is determined by testing or measuring, that a comb generator is provided with a number of antennas of preferably different transmitting characteristics, that the field distribution of the test object is determined by means of an appropriate, preferably simultaneous powering of the antennas, in particular in accordance with the parameters determined from the test object, and that the calibration factors determined for the simulated field strength distribution are employed in the measurement section for measurements of further test objects constructed in the same way.

By means of this method it is possible to determine calibration factors for the measurement sections to be measured, so that measurements which are performed in these measurement sections can be brought into a relationship with the measurements taken in the open field measuring site and test objects can be measured by means of this, which measurements can be related to the preset standard.

In accordance with several particular aspects of the invention, a measuring transmitter is provided which includes a comb generator, an antenna arrangement and powering means. The comb generator is preferably battery-operated and generates a frequency-stable comb spectrum and an amplitude-stable comb spectrum. The antenna arrangement generates selectable field distributions, and is connected to the comb generator and has at least two antennas of different types. The powering means connects the at least two antennas to the comb generator. The powering means connects the at least two antennas so that the comb generator will power the at least two antennas individually, in series, for use of the measuring transmitter to calibrate the measurement sections for measurement of interference fields. The powering means connects the at least two antennas so that the comb generator will power the at least two antennas simultaneously, for use of the measuring transmitter, as a radio interference simulator, the powering means comprising at least one coupling member for connecting the at least two antennas to the comb generator.

In accordance with several particular aspects of the invention, the powering means may further include a net for adapting the at least two antennas to the comb generator. The at least two antennas may include a loop antenna and a linear antenna. The at least two antennas are structurally different from each other and have different emission characteristics.

In accordance with yet a further aspect of the invention, the at least two antennas include at least one of symmetrical antennas, asymmetrical linear antennas, electrically limited antennas, loop antennas, aperture antennas, slot antennas, lines, dual-wire lines and multiple-wire liens. The at least two antennas may comprise antennas with adjustable terminal resistance.

In accordance with a further aspect of the invention, a measuring transmitter is provided which includes a comb generator, an arrangement of antennas, a means for powering the arrangement of antennas and a transistor. The comb generator is capable of being triggered by an oscillator which is battery-operated. The arrangement of antennas has a plurality of different emission characteristics. The means for powering the arrangement of antennas may power the arrangement of antennas with a broad-band comb spectrum. The transistor is operated in a controlled cascade breakdown, and is connected at a position downstream of the oscillator. A signal is obtained during the controlled cascade breakdown of the transistor and is provided to the antenna of the antenna arrangements as the comb spectrum. The broadband comb spectrum may extend up to 1 GHz, and may be amplitude-stable and frequency-stable. The broad-band comb spectrum may have a transmitting output of up to 0.07 mW. The broad-band comb spectrum may have spectrum lines with an output power of up to 0.1 mW. The transistor may comprise a bipolar transistor, and may be powered by a battery via a voltage transformer.

In accordance with yet a further aspect, the measuring transmitter further comprises an externally controllable splitter circuit, connected at a position downstream of the operator. The externally controllable splitter circuit is provided for adjusting the spacing of the spectrum line of the comb spectrum.

The measuring transmitter needs to be further provided with resistors for keeping the amplitude of the comb spectrum constant, and a quartz oscillator for keeping the frequency of the comb spectrum constant. In addition, the antennas may comprise antennas having different types of emission characteristics, including antennas which generate particularly high and particularly low characteristic impedances in the proximity zone of the antennas. The antennas may include a combination of symmetrical linear antennas. The combination of symmetrical linear antennas may comprise wire lines or dipoles. The wire lines or dipoles may comprise loop or slot antennas.

In accordance with yet a further aspect of the invention, the measuring transmitter may be provided with a control circuit for allowing operational control of the comb generator. The control circuits may comprise an optical decoder which has an input to which an optical waveguide is connected to facilitate the performance of a remote control by an operator. An output of the output decoder may be connected to the splitter circuit, and the measuring transmitter may be further provided with a timing member for controlling the transistor or the width of the lines of the comb spectrum. The remote control may be controlled by a computer. The timing member may comprise a carriage storage.

In accordance with a further aspect, the antennas are directly to the comb generator without the interposition of a filter or output amplifier. In the alternative, the at least two antennas in a previous version of the invention may be directly connected to the coupling member, without the interposition of a filter or output amplifier. In addition, the antennas may be connected to the transistor without the interposition of a filter or output amplifier. The antennas may comprise linear antennas or dipoles of a length of approximately 120 to 140 cm. The linear or dipoles may particularly have a length of approximately 130 cm. The antennas may comprise square loop antennas having a size of 25 to 40 cm by 25 to 40 cm. In particular, the square loop antennas may be of a size approximately 30 by 30 cm.

In accordance with a further aspect of the invention, the oscillator is connected to the base of a transistor, for setting a repetition rate of pulses. The antennas may be connected to the transistor on one of the emitter and collector sides of the transistor. The oscillator is connected to the base of the transistor by a splitter circuit. The measuring transmitter may further comprise a controllable carrier storage connected in series with the transistor for controlling a pulse length or line width, and for adjusting capacitance on the collector side of the transistor.

In accordance with yet a further aspect of the present invention, a method is provided for calibrating measuring sections for interference field measurement of electrical devices. The method comprises detecting, by means of a frequency spectrum, calibrating factors, generating fields in a known reference measuring section and generating fields in a measuring section to be calibrated by means of a measuring transmitter. The method further comprises measuring the fields in the known reference measuring section, and in the measuring section to be calibrated.

The method further comprises utilizing at least two antennas to generate the field in the measuring section to be calibrated and in the reference measuring section in sequential transmission-measurement cycles. The at least two antennas have emission characteristics which are different from each other because of the different structure of the respective ones of the at least two antennas. The fields are created in accordance with the types of antennas used for the measurements being made. The method further comprises calculating, from a comparison of the measured values, the calibrating factors as a function of the frequency for the field strength distribution of each of the emitting antennas.

In accordance with a further aspect of the invention, the frequency spectrum used for detecting the calibrating factor extends up to 1 GHz. The field may be generated in a known reference measuring section which comprises a standard measuring section or an open field measuring area. The measuring transmitter may comprise a comb generator. In addition, the measuring transmitter may comprise a radio interference transmitter. The field may be generated in a known reference measuring section with the same operational parameters, and the at least two antennas may comprise antennas of different types, including at least one loop antenna and one linear antenna.

In addition, in the method, the fields may be measured while maintaining the respectively same operational parameters. The method may further comprise detecting for each frequency extreme values of the calibration factors which are applicable to the defined field of distribution, and calculating a mean value of the extreme values which comprises one of a geometric and an arithmetic means. The method may further comprise calculating the difference between the calculated mean value and the extreme value, and using the calculated difference as the maximum possible measuring area.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF A PREFERRED EMBODIMENT

Figure 5:
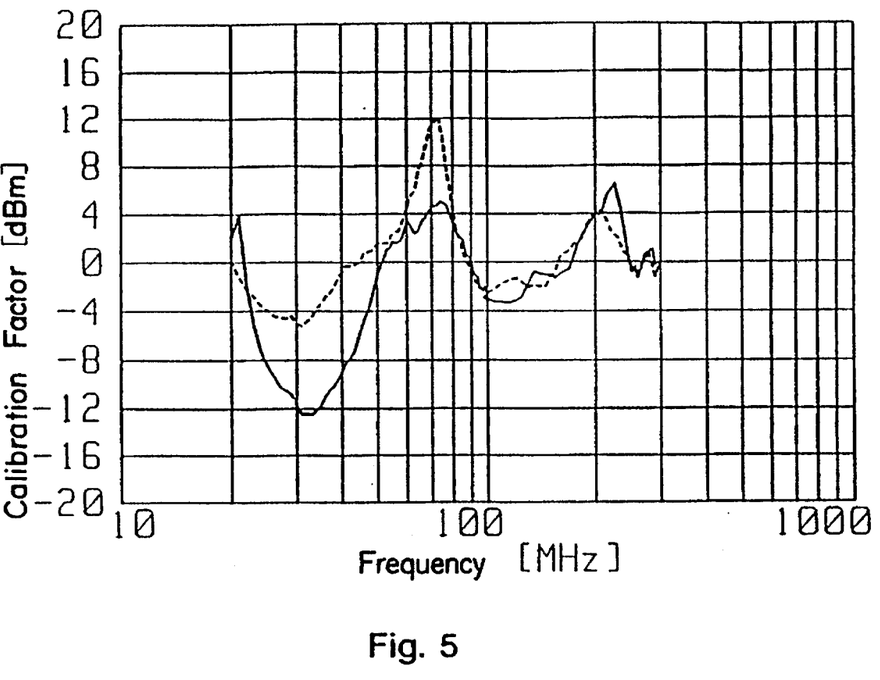
FIG. 5 show the calibration factors of an absorber shed.

The determined calibration factors of a particular absorber shed are entered in FIG. 5 as a function of the frequency. The calibration factors in connection with a set measuring distance are shown in solid lines for linear antennas, in dashed lines for coil antennas. It should be noted that the calibration factors change as a function of the frequency, so that the calibration factors must always be determined over a frequency range. The difference between the calibration factors for conductors (linear emitters) and that for conductor loops (coil antennas) is up to 8 dB, which corresponds to a factor of 6.4. Both emitter types can be present in actual electronic devices, so that it is also necessary to calibrate measurement sections for these two cases. Thus it is provided by the invention that the measuring sheds are calibrated at least for transmissions from conductor loops and for transmissions from conductors, where it can be advantageously provided to determine further calibration factors for other antennas with characteristic transmissions. However, determination of the transmission of coil antennas and linear conductors is the minimum requirement for the appropriate measuring of absorber sheds.

To prevent ungovernable field distortions because of antenna conductors during the calibrating operation, the reference field needs to be generated by a generator which has no metallic conductors at all. Otherwise it could not be assured that actually the same field would be generated during the reference measurement and measurement of the absorber shed to be calibrated, because already a slightly different position of a metallic conductor could considerably distort the measured result. Therefore generators to be employed during calibration do not have metallic conductors and are battery-operated and can possibly be operated remotely controlled by optical waveguides.

It is furthermore advantageous if the calibrating device generates a generator signal which is not overlaid by radio transmitters during reference measurements in the open. This generator signal must also be frequency- and amplitude-stable to make possible the automatic performance of the measurements. The frequency definition during calibration furthermore must be high enough, so that all effects on the wave propagation conditions to be calibrated are exactly determined. These conditions can be fulfilled by a comb generator in accordance with the invention or by means of the calibrating device in accordance with the invention or with the radio interference simulator in accordance with the invention.

Figure 1:
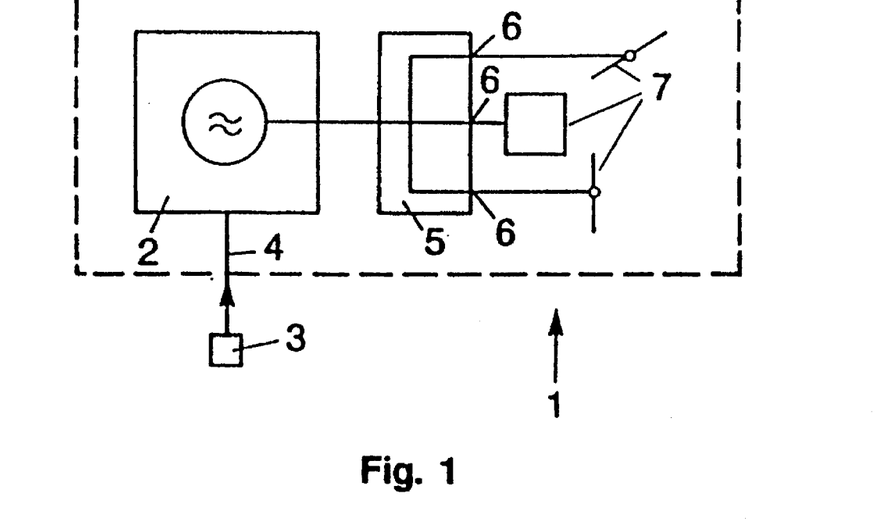
FIG. 1 is a block diagram of a radio interference simulator.

In accordance with FIG. 1, a radio interference simulator 1 of this type has a generator or comb generator 2 with a power supply in particular in battery form and a control logic 3, which is connected via optical waveguides 4 with the generator 2. The comb spectrum generated by the generator 2 is passed on to a coupling net 5 or appropriate connecting devices for coupling antennas with different transmitting characteristics, so that these antennas with different transmitting characteristics can be operated either simultaneously or individually in sequence. In this case it is possible, for example, to provide connections 6 for a number of antennas with different transmitting characteristics or only a single connection 6 which is assigned a suitable coupling net corresponding to the connected antenna, so that it becomes possible to transmit sequentially with different antennas. The individual antennas having different transmitting characteristics are designated by 7.

Figure 2:
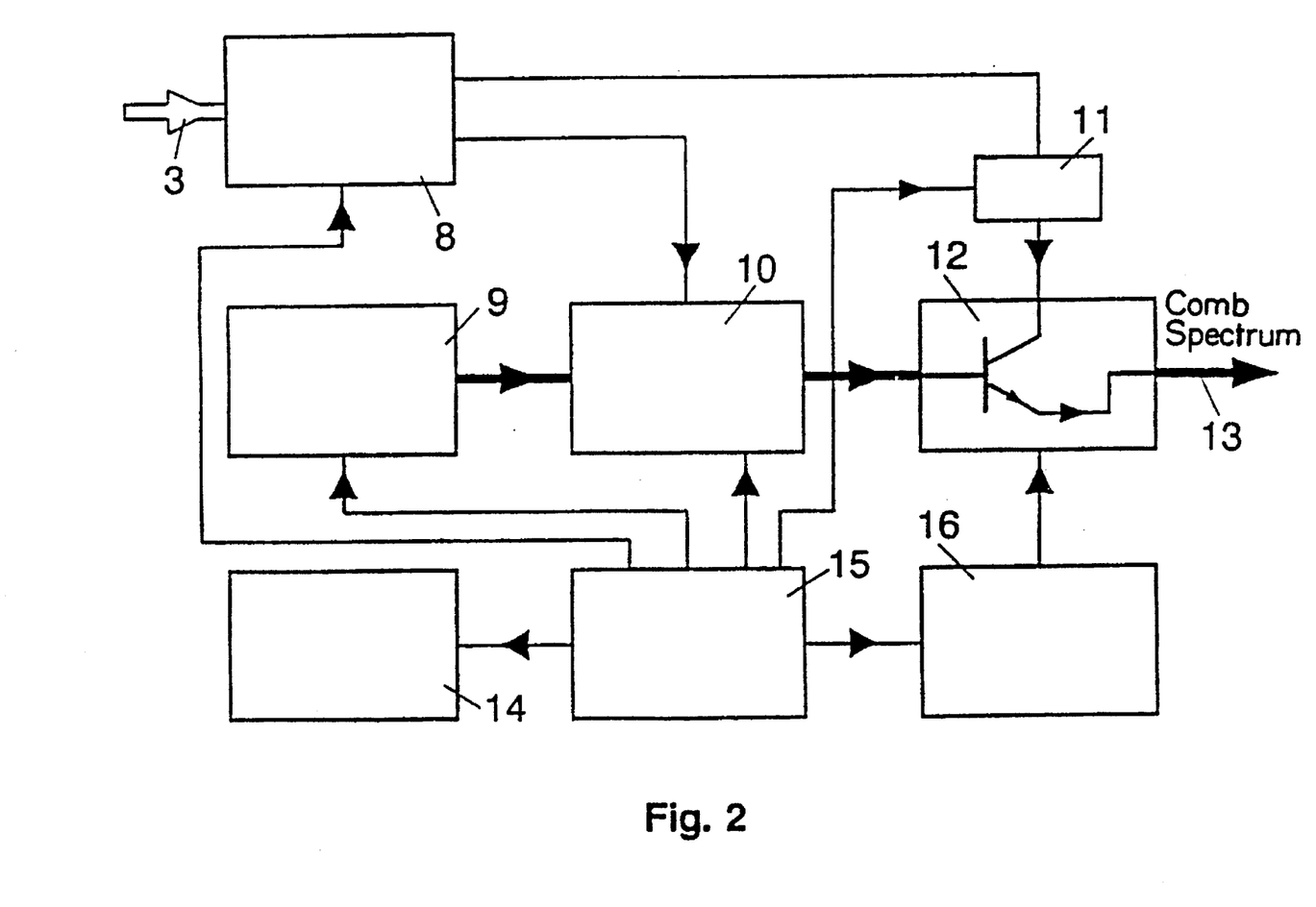
FIG. 2 shows the block diagram of a comb generator.

FIG. 2 shows a block diagram of a comb generator which can be employed in accordance with the invention. A quartz oscillator 9 controls, via a divider circuit 10, an avalanche stage 12 or a (bipolar) transistor operated in an avalanche breakthrough mode, which supplies the antennas 7 or the coupling net 5 via an antenna power line 13. The oscillator circuit, the divider circuit and an optical decoder 8 are provided with voltage by a battery 15, with an undervoltage warning 14 being provided. The avalanche stage 12 is operated via a voltage or circuit transformer 16, because this component must be operated with a higher voltage than battery voltage. A charge-storage unit 11, the capacity of which can be reversed via remotely- controllable adjustment devices 18, 19, for example relays, is used to adjust the pulse length of the transmission signals and for setting the line distance of the comb spectrum of the externally controllable divider circuit 10. Resistance wiring of the transistor in the avalanche stage 12 can be provided to keep the amplitude of the comb spectrum constant; the oscillator 9 is embodied as a quartz oscillator to keep the frequency constant.

Operation of the comb generator takes place via the optical decoder 8, which is remotely controlled via optical waveguides 3 by a computer and which takes on the appropriate control function.

Figure 6:
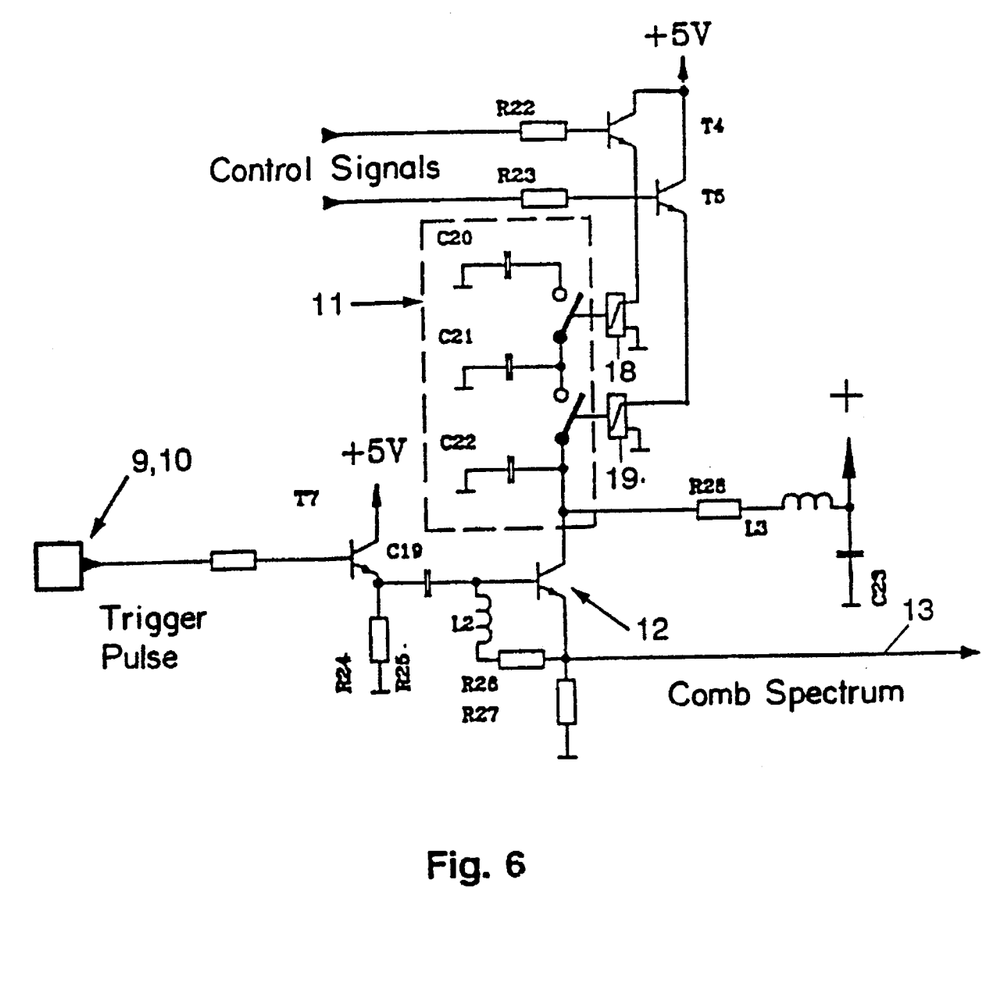
FIG. 6 is a detail of the block diagram in accordance with FIG. 1.

The following is an explanation, with the aid of FIG. 6, of the mode of operation of the avalanche stage. The clock generator 9 supplies trigger pulses of the desired repeat rate. The generation of the desired very short pulses takes place by means of the transistor 12 operated in a controlled avalanche breakthrough mode: the charge- storage unit 11 in the form of a storage circuit, consisting of the condensers C20, C21, C22, their connection line to the collector of the transistor 12 and the relay contacts of the relay 18, 19, is charged with a positive potential via the series circuit of R28 and L3 (the voltage is adapted to the type of transistor in this case), while the transistor 12 is still blocked. At the arrival of the trigger flank at the base of the transistor 12 the transistor breaks down because of the high collector-emitter voltage. However, current can only flow as long as the storage circuit 11 can provide charge carriers. Once the storage circuit is discharged, the collector is connected to zero potential and the transistor 12 is blocked again. For this purpose the time constant of the RL member R28 - L3 must be of such size that, although the storage circuit 11 can be fully charged during the blocked phase, no further current flow, which might maintain the breakthrough, is possible after the breakthrough of the transistor 12. To make the pulse length selective, the storage capacity of the storage circuit 11 is adjustable via the relay contacts and condensers C20/C21/C22; the greater the capacitance (parallel circuit), the longer the pulse length.

The elements R26 and L2, together with C19, form a differentiating member and shorten the trigger pulse.

Figure 7:
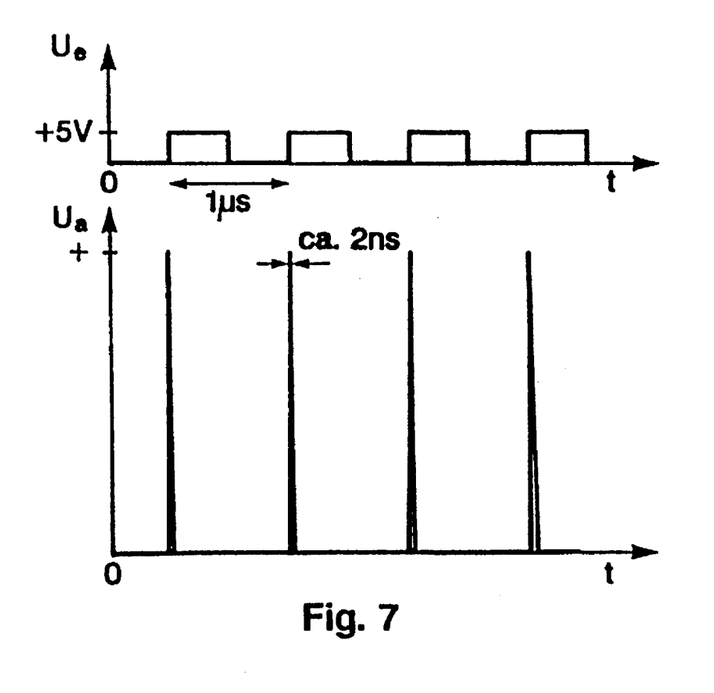
FIG. 7 is a further diagram.

In the present circuit the output signal is picked up by means of npn transistors at the working resistor R27 (emitter resistor). The use of a pnp transistor and working resistor in the collector circuit is also possible. The signal path at the input and output ($U_E$ . . . input voltage, $U_A$ . . . output voltage) of the avalanche stage is shown in FIG. 7, which illustrates the signal path at the input (top) and output (bottom) of the avalanche stage or at the base and emitter of the transistor 12. The time values apply to a 1 MHz spectrum.

The quartz oscillator 9 generates, for example, a 15 MHz oscillation; from this the possibly programmable divider 10 generates the base frequencies, in particular in the form of a rectangular oscillation which, for example, can be 10 kHz if divided if divided by 1500 or 1 MHz if divided by 15, etc. The transistor 12, which operates in an avalanche breakthrough mode, is triggered with these base frequencies. The transistor cuts through when the flank of the pulse in accordance with FIG. 7 is applied, which again causes shut-off by the storage circuit 11, which lowers the collector voltage and interrupts the breakthrough operation. Very short pulses with a typical pulse width of one nanosecond are generated at the output of the transistor 12 for a comb spectrum extending up to more than 1 GHz. The pulses periodically return and such a "pulse" has a comb tip (in the illustration over the time axis in the Fourier representation (illustration of the frequency spectrum obtained).

Symmetrical or asymmetrical linear antennas, electrically short antennas (dipoles), coil antennas, aperture emitters, slot antennas or conductors, in particular dual- or multi-wire conductors with possibly adjustable connection resistors, are provided as antennas which can be coupled with the comb generator. Among each other, the listed antennas have different transmitting characteristics.

The illustrated comb generator provides a broad-band amplitude- and frequency-stable pulse spectrum which is generated by operating the bipolar transistor in a controlled avalanche breakthrough mode. This type of pulse generation has the advantage of not requiring a broad-band, and thus expensive, pulse amplifier, since a sufficiently high output is already available at the output of the generator.

The installed quartz oscillator assures the stable comb spectrum with constant, arbitrarily selectable by means of switchable dividing factors, distances of the individual spectrum lines.

Figure 4A:
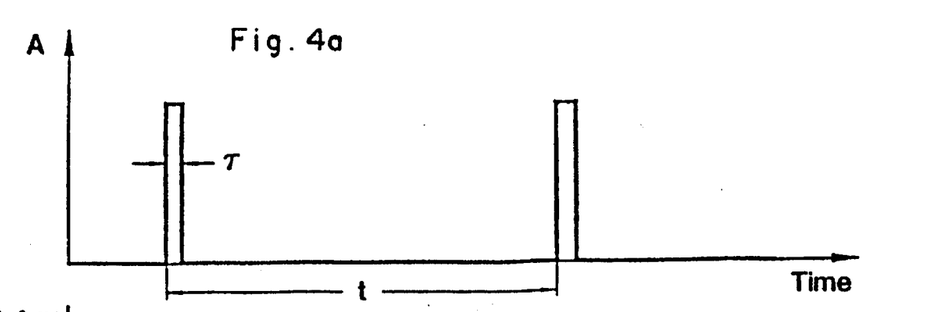
FIGS. 4a and 4b illustrate the temporal and spectral illustration of a periodic pulse.
Figure 4B:
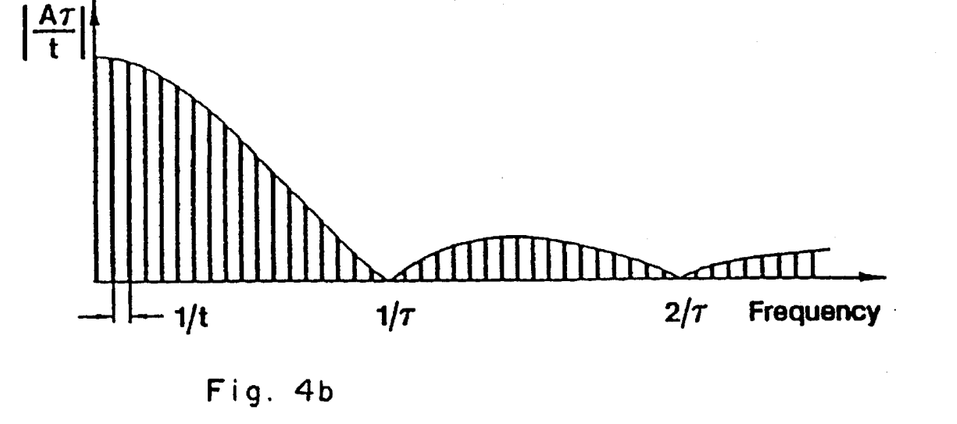

In accordance with FIGS. 4 and 4a, a periodic, pulse-shaped signal with the period length τ and the pulse length τ (FIG. 4a), composed of a base oscillation of a frequency 1/T and an infinite number of oscillations of whole-number multiples of this base frequency. In its spectral representation, the envelope of the amplitude of these oscillations has the shape sin x/x (x=aτ/T in accordance with FIG. 4b). The pulse length τ of the pulses of the generator used by the invention is short enough that the amplitudes of the individual spectral lines are almost constant (comb spectrum) within the frequency range of interest. Thus, in accordance with the above equation, a significant decrease of the oscillation amplitudes only takes place at frequencies which are not of interest. The frequency distance of the individual spectral lines can be adjusted to the desired value by means of the pulse repeat rate 1/T.

Figure 3A:
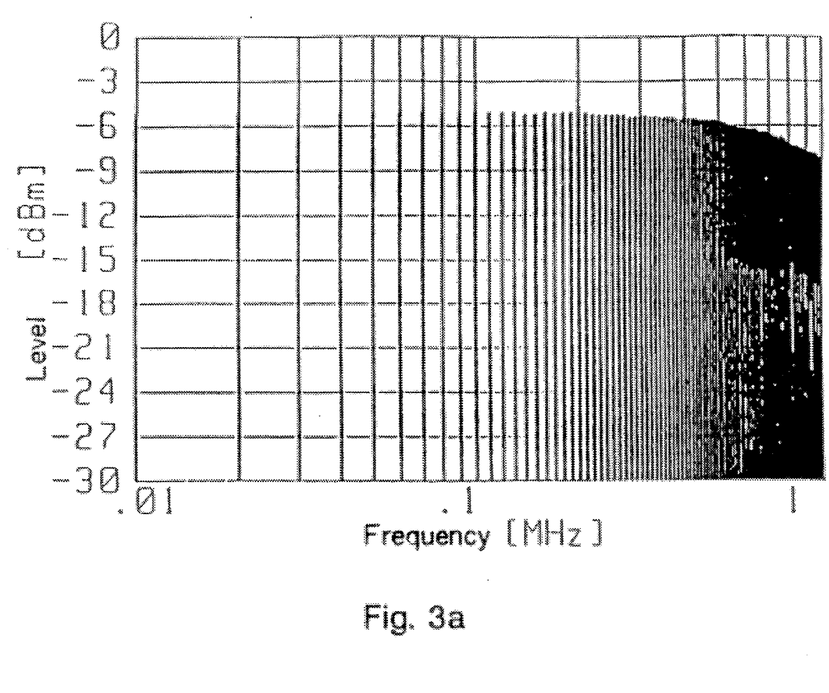
FIGS. 3a–3c illustrate the different comb spectra of a comb generator.
Figure 3B:
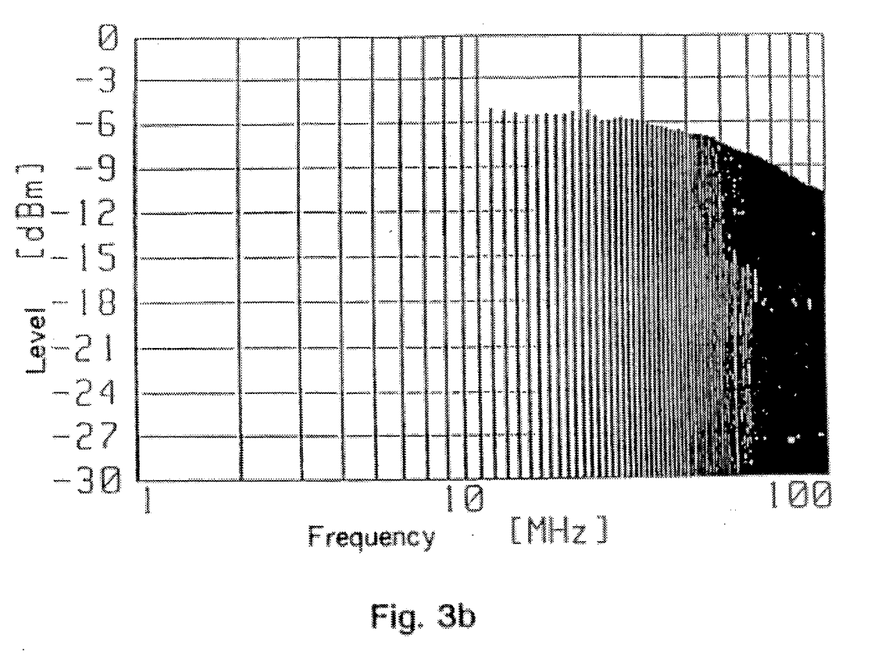
Figure 3C:
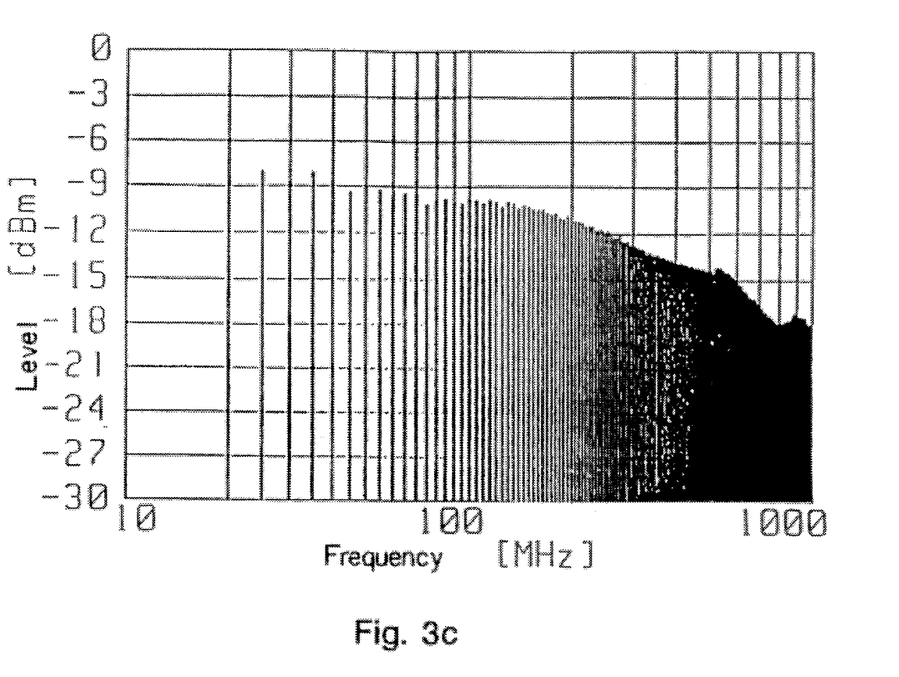

Accordingly, spectra with line distances of 10 kHz, 1 MHz and 5 MHz can be selected in the illustrated embodiment. Frequency ranges and output levels per spectral line for these spectra can be found in FIG. 3.

Any effect of the individual characteristics because of metallic conductors is prevented by the battery operation of the apparatus of the invention, because the remote control of the transmitter for the fully automatic detection of the measured values and processing of the measured values takes place via optical waveguides. The connected antennas are powered with the correct phase and the correct level via the net 5, even though they have different connecting parameters or transmission parameters. The previously mentioned emitting characteristics can replace the radiating conductor elements appearing in actual test objects, which normally are:

radio transmitting antennas: replaced by asymmetrical linear antennas and coil antennas slots and openings in the housing: by coil antennas and aperture emitters cable connections to the outside: by dual- or multi-wire conductors and symmetrical linear antennas grounded surfaces inside the housing: by aperture emitters conductor tracks on the inside of the test object: by symmetrical antennas, electrically short dipoles, coil antennas and dual- and multi-wire conductors.

Thus, in accordance with the invention it is possible to calibrate measuring sections with different fields or test objects can be imitated by the employment of different antennas.

The calibration of a measuring section for interference field strength measurements, for example of an absorber shed, can be performed as follows with the aid of a radio interference simulator in accordance with the invention. For example, the radio interference simulator is equipped or operated one time with a linear antenna and another time with a coil antenna. In this case the size of these antennas is selected to be such that there is room for the antennas in those test objects for which the calibration is to be valid. The simulator is then operated one time in connection with the measuring device to be calibrated, for example an absorber shed, and another time in connection with a reference device, for example an open field measuring site adhering to the standard. In either case the field strengths are measured in accordance with a definite test standard. The comparison of the measured results of the measuring device to be calibrated and the measuring device adhering to the standard provides the calibration factors for the measuring device to be calibrated.

The following procedure is followed in connection with test objects, the transmission characteristics of which are a priori unknown, which is normally the case: the mean value of the measured calibration factors for each frequency is determined by computation. This mean value is used as calibration factor during interference field strength measurements of actual test objects. The deviations from the mean value of the calibration factors which are in particular valid for linear antennas and coil antennas result in the greatest possible uncertainty of the measured result.

The advantage of the invention over customary calibrating devices lies in that the measurement sections for interference field strength measurement can be calibrated for exactly the requirements of actual measuring practice, instead of for only one special field distribution which for all practical purposes never occurs in measuring practice. The measurement uncertainty in the course of interference field strength measurements in absorber sheds can be significantly reduced by means of such a calibration.

Simulation of the interference radiation of actual test objects can be performed with the aid of the radio interference simulator in such a way that the generator is simultaneously connected with a number of transmission antennas via the coupling net; the types of antenna appropriate to the electrical structure of the test object are employed and powered.

At least one coil antenna and one linear antenna are employed to simulate a test object, because these are the most often occurring interference emitters or have the most different characteristics. When simulating test objects, the individual antennas are simultaneously powered. When calibrating the measurement sections, the individual antennas connected with the comb generator are powered sequentially, i.e. at different measurement cycles, or the antenna, the transmitted field of which was measured, is removed and an antenna with a different transmission characteristic is connected to the comb generator via the coupling net assigned to it.

Measurement of the fields can be performed in various ways, however preferably in the standardized manner. The more calibration factors for differently transmitting antennas are known in a measurement section, the more accurate the measurement of the interference fields emitted by test objects can be; however, up to now calibration was only performed in relation to a single field, so that a considerable improvement of the testing standard is attained by the process of the invention, in particular if the calibration factors are determined over the entire frequency range. In addition it has been shown that the calibration factors have different paths for different emitting characteristics or different waves, so that in no case can the calibration factors determined for a defined emitting characteristic also be used for measuring emissions of a different antenna.

The antenna size of dipole antennas is selected to be such that the highest field strength is generated with those frequencies where the strongest radio signals were present in the open. This is the case in the FM range (approximately 88 to 104 MHz) in the frequency range from 30 to 1000 MHz. With this, the distance between usable and interference signals is maximized on an open field measurement site. It is thus advantageous to employ linear antennas or dipoles of a length between 110 to 150 cm, preferably 140 cm, in particular approximately 130 cm.

For coil antennas the dimensions of the coil are selected to be such that square coil antennas of a size of 25 to 40 cm×25 to 40 cm, preferable approximately 30×30 cm are used. If, for example, a dimension of 10 cm or less is selected, the field strength attained is unsuitable for practical measuring on the open field measurement site. If the coil dimensions are selected to be very large, for example 50 cm or larger, a strong waviness in the frequency path of the generated field strength occurs. A coil diameter or a lateral length of approximately 30 cm has shown to be a good compromise.

Reduction in the size of the antenna and possibly powering via a resistor net is recommended for reducing the waviness of the frequency path at frequencies above approximately 200 MHz. This reduction takes place as a function of the desired transmission output and can usefully lead to an approximate reduction of up to approximately 30% of the cited values.

We claim:

1. A measuring transmitter comprising:

a comb generator which is preferably battery operated and which generates a frequency-stable comb spectrum and an amplitude-stable comb spectrum;

an antenna arrangement for generating selectable field distributions, said antenna arrangement being connected to said comb generator and having at least two antennas of different types;

powering means for connecting said at least two antennas to said comb generator, said powering means connecting said at least two antennas so that said comb generator will power said at least two antennas individually, in series, for use of the measuring transmitter to calibrate measurement sections for measurement of interference fields, and said powering means connecting said at least two antennas so that said comb generator will power said at least two antennas simultaneously, for use of the measuring transmitter as a radio interference simulator, said powering means comprising at least one coupling member for connecting said at least two antennas to said comb generator.

2. The measuring transmitter according to claim 1, wherein said powering means further comprises a net for adapting said at least two antennas to said comb generator.

3. The measuring transmitter according to claim 1, wherein said at least two antennas comprise a loop antenna and a linear antenna.

4. The measuring transmitter according to claim 1, wherein said at least two antennas are structurally different from each other and have different emission characteristics.

5. The measuring transmitter according to claim 1, wherein said at least two antennas comprise at least one of symmetrical linear antennas, asymmetrical linear antennas, electrically limited antennas, loop antennas, aperture antennas, slot antennas, lines, dual-wire lines, and multiple-wire lines.

6. The measuring transmitter according to claim 5, wherein said at least two antennas comprise antennas with adjustable terminal resistance.

7. A measuring transmitter comprising:

a comb generator capable of being triggered by an oscillator which is battery-operated;

an arrangement of antennas having a plurality of different emission characteristics;

means for powering said arrangement of antennas with a broad-band comb spectrum;

a transistor, operated in a controlled cascade breakdown, said transistor being connected at a position downstream of said oscillator, a signal being obtained during the controlled cascade breakdown of said transistor and being provided to said antenna of said antenna arrangement as said comb spectrum.

8. The measuring transmitter according to claim 7, wherein said broad-band comb spectrum extends up to 1 GHz and is amplitude-stable and frequency-stable.

9. The measuring transmitter according to claim 8, wherein said broad-band comb spectrum has a transmitting output of up to 0.07 mW.

10. The measuring transmitter according to claim 9, wherein said broad-band comb spectrum has spectrum lines with an output power of up to 0.1 mW.

11. The measuring transmitter according to claim 9, wherein said transistor comprises a bipolar transistor.

12. The measuring transmitter according to claim 11, wherein said transistor is powered by a battery via a voltage transformer.

13. The measuring transmitter according to claim 11, further comprising an externally controllable splitter circuit, connected at a position downstream of said operator, said externally controllable splitter circuit being provided for adjusting the spacing of the spectrum lines of said comb spectrum.

14. The measuring transmitter according to claim 11, further comprising resistors for keeping the amplitude of said comb spectrum constant.

15. The measuring transmitter according to claim 11, further comprising a quartz oscillator for keeping the frequency of said comb spectrum constant.

16. The measuring transmitter according to claim 11, wherein said antennas comprise antennas having different types of emission characteristics, including antennas which generate particularly high and particularly low characteristic impedances in the proximity zone of said antennas.

17. The measuring transmitter according to claim 16, wherein said antennas comprise a combination of symmetrical linear antennas.

18. The measuring transmitter according to claim 17, wherein said combination of symmetrical linear antennas comprises wire lines or dipoles.

19. The measuring transmitter according to claim 18, wherein said wire lines or dipoles comprise loop or slot antennas.

20. The measuring transmitter according to claim 11, further comprising a control circuit for allowing operational control said comb generator.

21. The measuring transmitter according to claim 20, wherein said control circuit comprises an optical decoder, said optical decoder having an input to which an optical waveguide is connected to facilitate the performance of a remote control by an operator, an output of said output decoder being connected to said splitter circuit, said measuring transmitter further comprising a timing member for controlling said transistor or the width of the lines of said comb spectrum.

22. The measuring transmitter according to claim 21, wherein said remote control is performed by a computer.

23. The measuring transmitter according to claim 22, wherein said timing member comprises a carrier storage.

24. The measuring transmitter according to claim 11, wherein said antennas are directly connected to said comb generator without the interposition of a filter or output amplifier.

25. The measuring transmitter according to claim 1, wherein said at least two antennas are directly connected to said coupling member without the interposition of a filter or output amplifier.

26. The measuring transmitter according to claim 11, wherein said antennas are connected to said transistor without the interposition of a filter or output amplifier.

27. The measuring transmitter according to claim 11, wherein said antennas comprise linear antennas or dipoles of a length of 120 to 140 cm.

28. The measuring transmitter according to claim 27, wherein said linear antennas or dipoles have a length of approximately 130 cm.

29. The measuring transmitter according to claim 11, wherein said antennas comprise square loop antennas of a size of 25 to 40 cm by 25 to 40 cm.

30. The measuring transmitter according to claim 29, wherein said square loop antennas are of a size of approximately 30 by 30 cm.

31. The measuring transmitter according to claim 11, wherein said oscillator is connected to the base of said transistor, for setting a repetition rate of pulses, said antenna being connected to said transistor on one of the emitter and collector sides of said transistor.

32. The measuring transmitter according to claim 31, wherein said oscillator is connected to the base of said transistor via a splitter circuit.

33. The measuring transmitter according to claim 32, further comprising a controllable carrier storage connected in series with said transistor for controlling a pulse length or line width, and for adjusting capacitance on the collector side of said transistor.

34. A method for calibrating measuring sections for interference field measurement of electrical devices, said method comprising detecting, by means of a frequency spectrum, calibrating factors, generating fields in a known reference measuring section and generating fields in a measuring section to be calibrated by means of a measuring transmitter, and measuring the fields in the known reference measuring section, and in the measuring section to be calibrated, said method further comprising:

utilizing at least two antennas to generate the fields in the measuring section to be calibrated and in the reference measuring section in sequential transmission-measurement cycles, said at least two antennas having emission characteristics which are different from each other because of the different structure of the respective ones of said at least two antennas, said fields being created in accordance with the types of antennas used for the measurements being made; and calculating, from a comparison of the measured values, the calibrating factors as a function of the frequency for the field strength distribution of each of the emitting antennas.

35. The method according to claim 34, wherein the frequency spectrum used for detecting the calibrating factors extends up to 1 GHz.

36. The method according to claim 34, wherein the fields are generated in a known reference measuring section which comprises a standard measuring section or an open field measuring area.

37. The method according to claim 36, wherein said measuring transmitter comprises a comb generator.

38. The method according to claim 36, wherein said measuring transmitter comprises a radio interference transmitter.

39. The method according to claim 36, wherein the fields are generated in a known reference measuring section with the same operational parameters.

40. The method according to claim 39, wherein said at least two antennas comprise antennas of different types, including at least one loop antenna and one linear antenna.

41. The method according to claim 40, wherein the fields are measured while maintaining the same respective operational parameters.

42. The method according to claim 41, further comprising detecting for each frequency, extreme values of said calibration factors which are applicable to the defined field distribution, and calculating a mean value of the extreme values which comprises one of a geometric and an arithmetic mean.

43. The method according to claim 42, further comprising calculating the difference between the calculated mean value and the extreme values, and using the calculated difference as the maximum possible measuring area.

\* \* \* \* \*